(12) United States Patent
Nagatsuka et al.

(10) Patent No.: US 6,178,961 B1
(45) Date of Patent: Jan. 30, 2001

(54) WIRE SAW CONTROL METHOD AND WIRE SAW

(75) Inventors: Shinji Nagatsuka; Shigeru Okubo; Hiroshi Kawarai, all of Mitaka; Hiroshi Oishi, Annaka; Keiichiro Asakawa, Annaka; Junichi Matsuzaki, Annaka, all of (JP)

(73) Assignees: Tokyo Seimitsu Co., Ltd., Tokyo (JP); Super Silicon Crystal Research Institute Corp., Gumma (JP)

( * ) Notice: Under 35 U.S.C. 154(b), the term of this patent shall be extended for 0 days.

(21) Appl. No.: 09/492,839

(22) Filed: Jan. 27, 2000

(30) Foreign Application Priority Data

Jan. 28, 1999 (JP) .................................................. 11-019566

(51) Int. Cl.[7] ....................................................... B28D 1/08
(52) U.S. Cl. ............................... 125/21; 451/5; 125/16.02
(58) Field of Search .................................. 451/5, 8, 9, 10; 125/21, 13.01, 13.02, 16.02, 16.01; 83/821–829, 762, 763, 651.1

(56) References Cited

U.S. PATENT DOCUMENTS

| | | | | |
|---|---|---|---|---|
| 5,628,301 | * | 5/1997 | Katamachi | 125/16.02 |
| 5,937,844 | * | 8/1999 | Kiuchi et al. | 125/21 |
| 5,944,007 | * | 8/1999 | Miyoshi et al. | 125/21 |
| 5,947,798 | * | 9/1999 | Toyama | 125/21 |

FOREIGN PATENT DOCUMENTS

1177509 * 3/1999 (JP) ........................................ 125/21

* cited by examiner

*Primary Examiner*—Derris H. Banks
(74) *Attorney, Agent, or Firm*—Nixon Peabody LLP; David S. Safran (57) ABSTRACT

A sensor measures a displacement of a sensor, and a control part of a wire saw calculates a sliding load in accordance with the measured displacement and an initial tension of the wire. Then, the control part compares the calculated cutting load with a preset reference value, and controls an ingot feed speed for a drive unit of a workpiece feed table in accordance with the results of the comparison.

9 Claims, 13 Drawing Sheets

WIRE SAW CONTROL METHOD AND WIRE SAW

BACKGROUND OF THE INVENTION

1. Field of the Invention

The present invention relates generally to a wire saw control method and a wire saw for slicing a workpiece such as silicon, glass and ceramics, into a number of wafers.

2. Description of Related Art

A wire saw forms a wire row by winding a wire on a plurality of grooved rollers, and runs the wire at a high speed and presses a workpiece against the wire row to thereby slice the workpiece into wafers. When the wire saw slices a column-shaped workpiece, the slicing length varies according to the slicing positions such as a slicing start position, a slicing end position and a slicing intermediate position. This changes the cutting resistance to the wire and the wire deflection (a wire displacement in a workpiece feeding direction). The change in the wire deflection causes the wire to run unstably and deteriorates the workpiece slicing accuracy.

To address this problem, a conventional wire saw estimates the cutting resistance according to the workpiece slicing position, and controls a workpiece feed speed according to the estimated cutting resistance, thus preventing a change in the wire deflection.

The cutting resistance, however, varies according to a variety of conditions such as the shape of the workpiece and the workpiece feed speed, and thus, it is difficult to correctly estimate the cutting resistance. For this reason, the conventional wire saw cannot slice the workpiece accurately.

SUMMARY OF THE INVENTION

In view of the foregoing, it is an object of the present invention to provide a wire saw control method and a wire saw for accurately slicing a workpiece.

The above object can be achieved by providing a wire saw control method, which comprises forming a wire row by winding a wire on a plurality of grooved rollers, running said wire, feeding a workpiece to said wire row and pressing said workpiece against said wire row while supplying a machining liquid to said wire row to thereby slice said workpiece into a number of wafers; said method comprising the steps of: measuring a displacement of said wire forming said wire row during the slicing of said workpiece; calculating a cutting load against said wire row in accordance with said measured displacement and an initial tension of said wire; and comparing said calculated cutting load with a preset reference value, and then slicing said workpiece while controlling a workpiece feed speed according to the results of the comparison.

The above object can also be achieved by providing a wire saw, which forms a wire row by winding a wire on a plurality of grooved rollers, runs said wire, feeds a workpiece to said wire row and presses said workpiece against said wire row while supplying a machining liquid to said wire row to thereby slice said workpiece into a number of wafers; said wire saw comprising: a sensor for measuring a displacement of said wire forming said wire row during the slicing of said workpiece; workpiece feeding means for moving said workpiece forward and backward with respect to said wire row; and control means for calculating a cutting load against said wire row in accordance with said displacement measured by said sensor and an initial tension of said wire, comparing said calculated cutting load with a preset reference value and controlling a workpiece feed speed of said workpiece feeding means according to the results of the comparison.

This invention controls the slicing of the workpiece in accordance with the cutting load in view of the fact that the wire deflection depends on the cutting load (the load on the workpiece in a direction opposite to a workpiece feed direction).

According to the present invention, the displacement of the wire is measured, and the cutting load on the wire is calculated according to the wire deflection and the initial tension of the wire. Then, the calculated cutting load is compared with the reference value, and the workpiece feed speed is controlled according to the results of the comparison. For example, if the cutting load is controlled to be always the preset value, the workpiece can be sliced accurately. Since the cutting load is calculated according to the displacement and the initial tension of the wire, the cutting load can be calculated correctly even if the initial tension of the wire is changed.

According to the present invention, the wire saw further comprises driving means for moving said sensor forward and backward with respect to said wire row and measuring means for measuring the movement amount of said sensor. The driving means moves said sensor forward and backward according to a position of said wire forming said wire row, and the movement measured by said measuring means is added to a measured value of said sensor to thereby calculate the displacement of said wire. This widens the measurement range of the wire displacement and enables the measurement of the displacement even if the wire is displaced widely.

According to the present invention, the sensor is arranged above the wire row, and this prevents the machining liquid supplied to the wire row, i.e., a slurry from adhering to the sensor. Thus, the sensor can measure the wire displacement without being affected by the slurry.

According to the present invention, the sensor is arranged opposite side of a side where the wire is displaced with respect to the wire row. This prevents the displaced wire from contacting with and damaging the sensor. The wire saw has moving means for moving back said sensor from said wire row, and said moving means moves back said sensor from said wire row when the sliced workpiece is moved back from said wire row. This prevents the wire, which is displaced in the opposite direction by being dragged by the moved-back wire, from contacting with and damaging the sensor.

According to the present invention, the sensor is detachably supported by a bracket rotatably supporting said plurality of grooved rollers. Therefore, the position of the sensor with respect to the wire row can be adjusted easily.

According to the present invention, a cover is attached to a sensing part of said sensor in order to protect said sensing part.

According to the present invention, the sensor is inclined in a wire displaced direction with respect to a wire row by a predetermined angle. For example, the sensor is inclined by half an angle between an unloaded wire and a wire with the allowable maximum load, if an eddy-current displacement meter is used as the sensor. The sensitivity of the sensor is usually lowered as the angle between the sensor and the wire is broadened. In this invention, the sensitivity of the sensor is not lowered even if the wire is displaced and the angle of the sensor is changed since the sensor is previously inclined to the wire displaced direction.

According to the present invention, the displacement of the wire measured by said sensor is corrected previously in accordance with a measured distance between said sensor and said wire. Conventionally, it is difficult to accurately measure the displacement of the wire because the area of the wire is smaller than a detection area for an ordinary non-contact sensor. A data table of the output values of the sensor and the displacement of the wire is previously produced from data obtained by sliding the sensor vertically in the state where the sensor is actually attached (same as the operation state). The output values are converted to the displacement of the wire according to the data table. Consequently, the distance between the wire and the sensor can be correctly measured, and the displacement of the wire can be measured accurately.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

A description will now be given of the entire structure of a wire saw 10 according to the first embodiment of this invention.

Figure 1:
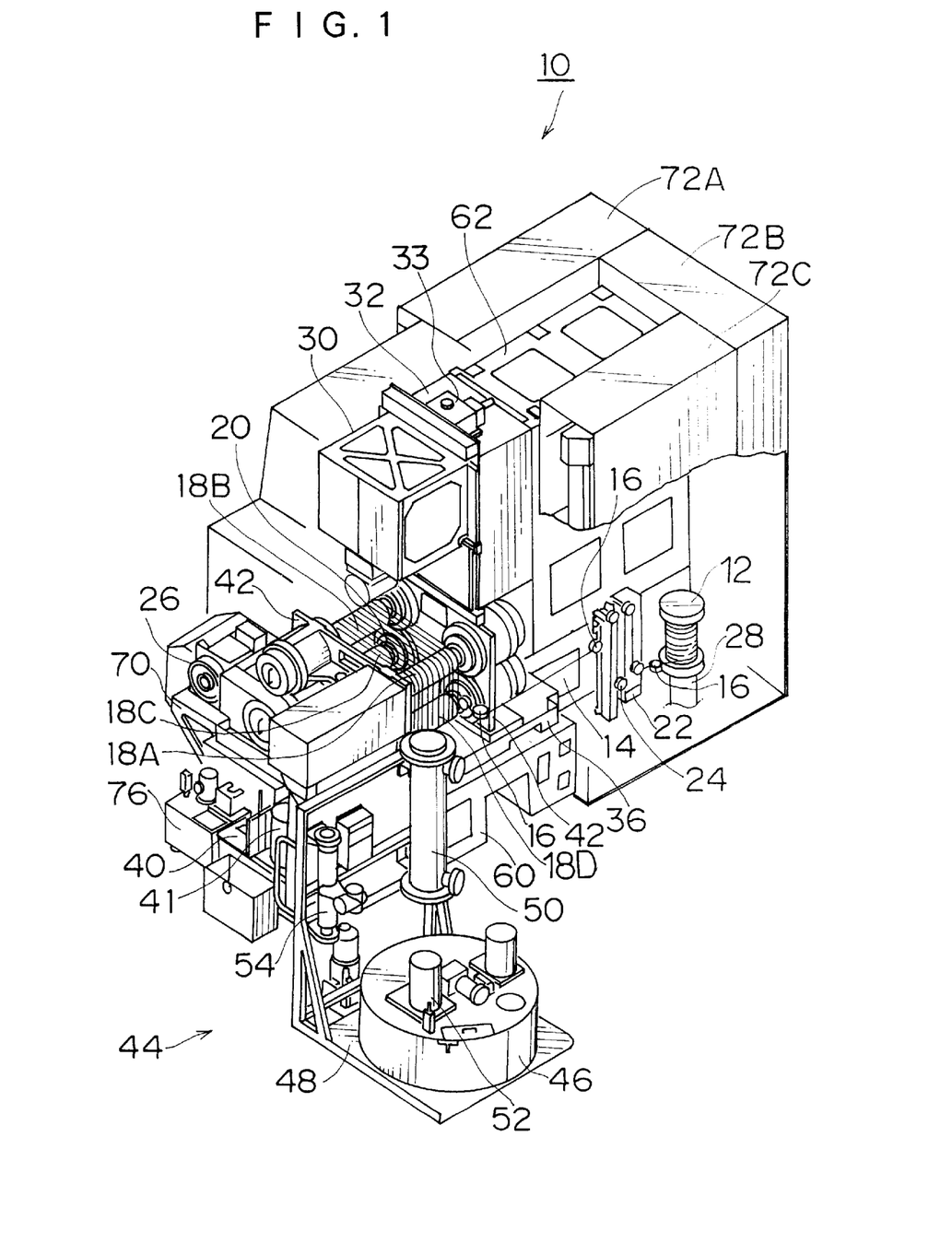
FIG. 1 is a view showing the entire structure of a wire saw according to the first embodiment of the present invention.

As shown in FIG. 1, the wire saw 10 has a pair of wire reels 12 (only one wire reel is illustrated). A wire 14 wound around the one wire reel 12 is wound on four grooved rollers 18A, 18B, 18C, 18D a plurality of times via one wire running passage composed of a number of guide rollers 16 to thereby form a parallel wire row 20. Then, the wire 14 is wound around the other wire reel 12 (not illustrated) via the other wire running passage, which has the same structure as the one wire running passage. The wire running passages are formed symmetrically with respect to the wire row 20.

The wire running passages formed at both sides of the wire row 20 are respectively provided with a traverser 22 and a dancer roller 24 (only one wire running passage is illustrated). One traverser 22 winds the wire 14 around the wire reel 12 or feeds the wire 14 from the wire reel 12 at a constant speed. A predetermined weight (not illustrated) is suspended from one dancer roller 24, and the weight applies a constant tension to the running wire 14. A cleaning apparatus (not illustrated) is provided on the wire running passage, which jets a cleaning liquid to the running wire 14 to thereby remove the slurry from the wire 14.

The both ends of the four grooved rollers 18A–18D, on which the wire 14 is wound, are rotatably supported by a pair of spindle brackets 42 which is arranged oppositely. The grooved rollers 18A–18D are arranged so that the axes of the grooved rollers 18A–18D can form a rectangular. The spindle brackets 42 are provided on an oil pan 36, which will be described later.

The grooved roller 18C and the pair of wire reels 12 connect to motors 26, 28, respectively, which are rotatable forward and backward. Running the motors 26, 28 runs the wire 14 at a high speed between the pair of wire reels 12.

A workpiece feed table 30 is attached to a feed base 32 above the wire row 20 in such a manner as to freely slide vertically. A drive unit 33 of the feed base 32 moves the workpiece feed table 30 vertically with respect to the wire row 20. An ingot (not illustrated), whose crystal axis is oriented in a predetermined direction, is held at the bottom of the workpiece feed table 30.

The oil pan 36 is placed below the wire row 20, and the oil pan 36 collects the slurry supplied to the wire row 20. An inclined plane is formed inside the oil pan 36, and a collecting pipe (not illustrated) connects to the bottom end of the inclined plane. The end of the collecting pipe connects to a slurry collecting tank 40, and the slurry collected in the oil pan 36 is stored in the slurry collecting tank 40 through the collecting pipe. The slurry collecting tank 40 temporarily contains the slurry, and the slurry in the slurry collecting tank 40 is collected in a slurry tank 46 of a later-described slurry supply unit 44 whenever necessary.

The slurry supply unit 44 is constructed in such a manner that the slurry tank 46, a heat exchanger 50, a pump 52, a flowmeter 54 and so on are mounted on a movable cart 48. The slurry tank 46 connects to a tube (not illustrated), and the end of the tube is detachably connected to a pump 41 at the top of the slurry collecting tank 40. Consequently, the pump 41 raises the slurry stored in the slurry collecting tank 40 to be stored in the slurry tank 46, and then the pump 52 raises the slurry stored in the slurry tank 46 to be jetted to the wire row 20 from a slurry nozzle (not illustrated) arranged above the wire row 20. The jetted slurry is collected in the oil pan 36 as described previously, and is returned to the slurry tank 46 via the slurry collecting tank 40. The slurry is circulated in this manner. The heat exchanger 50 maintains the circulated slurry at a constant temperature.

Figure 2:
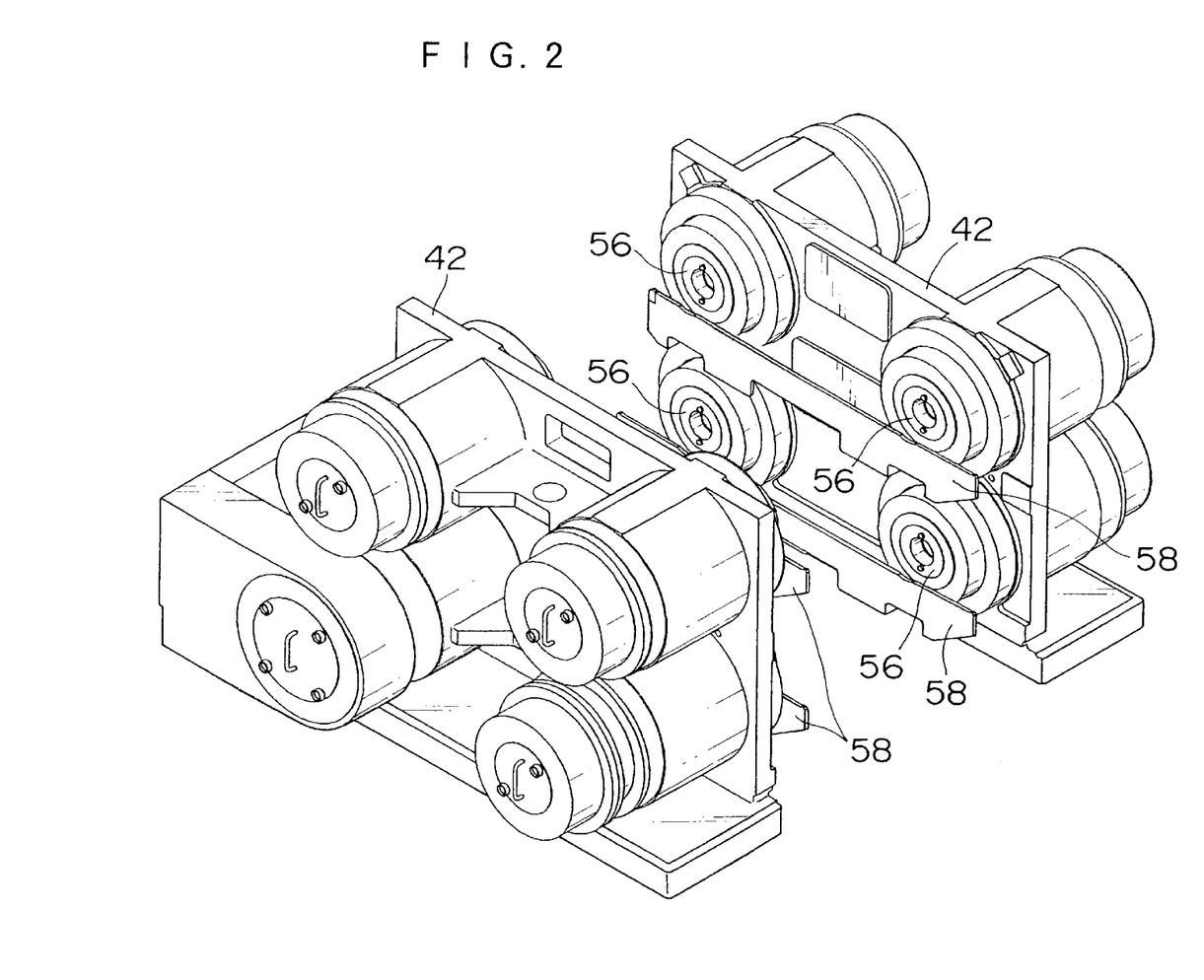
FIG. 2 is a perspective view showing a bracket in FIG. 1.

FIG. 2 is a perspective view showing the pair of spindle brackets 42.

As shown in FIG. 2, the pair of spindle brackets 42 is arranged oppositely, and each spindle bracket 42 rotatably supports four spindle units 56. The grooved rollers 18A–18D are rotatably supported between the spindles 56.

Upper and lower guide rails 58 are attached to the lower parts of the spindle units 56 in each spindle bracket 42. The grooved rollers 18A–18D are guided on the guide rails 58 and are attached to the spindle units 56.

Figure 3:
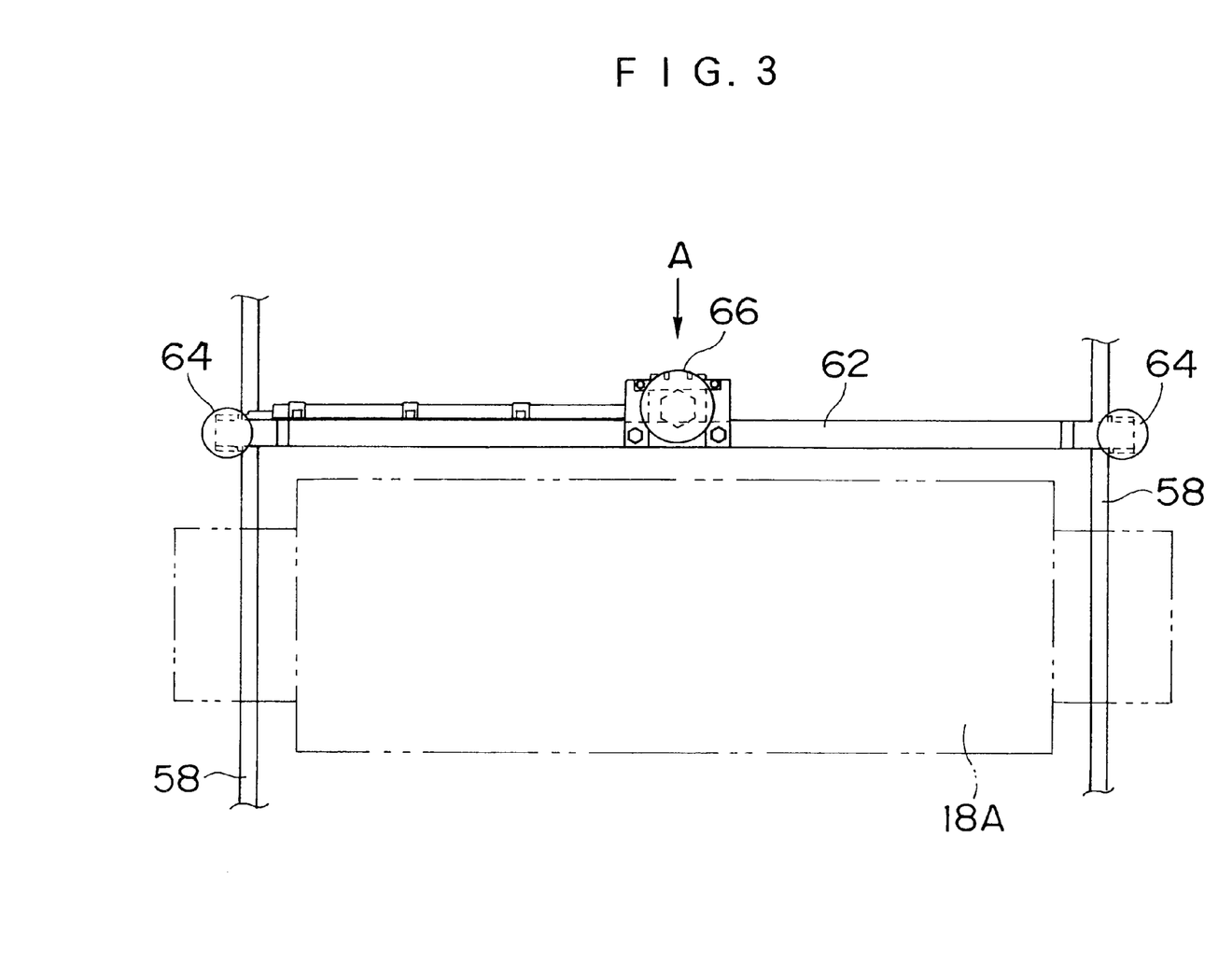
FIG. 3 is a plan view showing the essential elements of the present invention.
Figure 4:
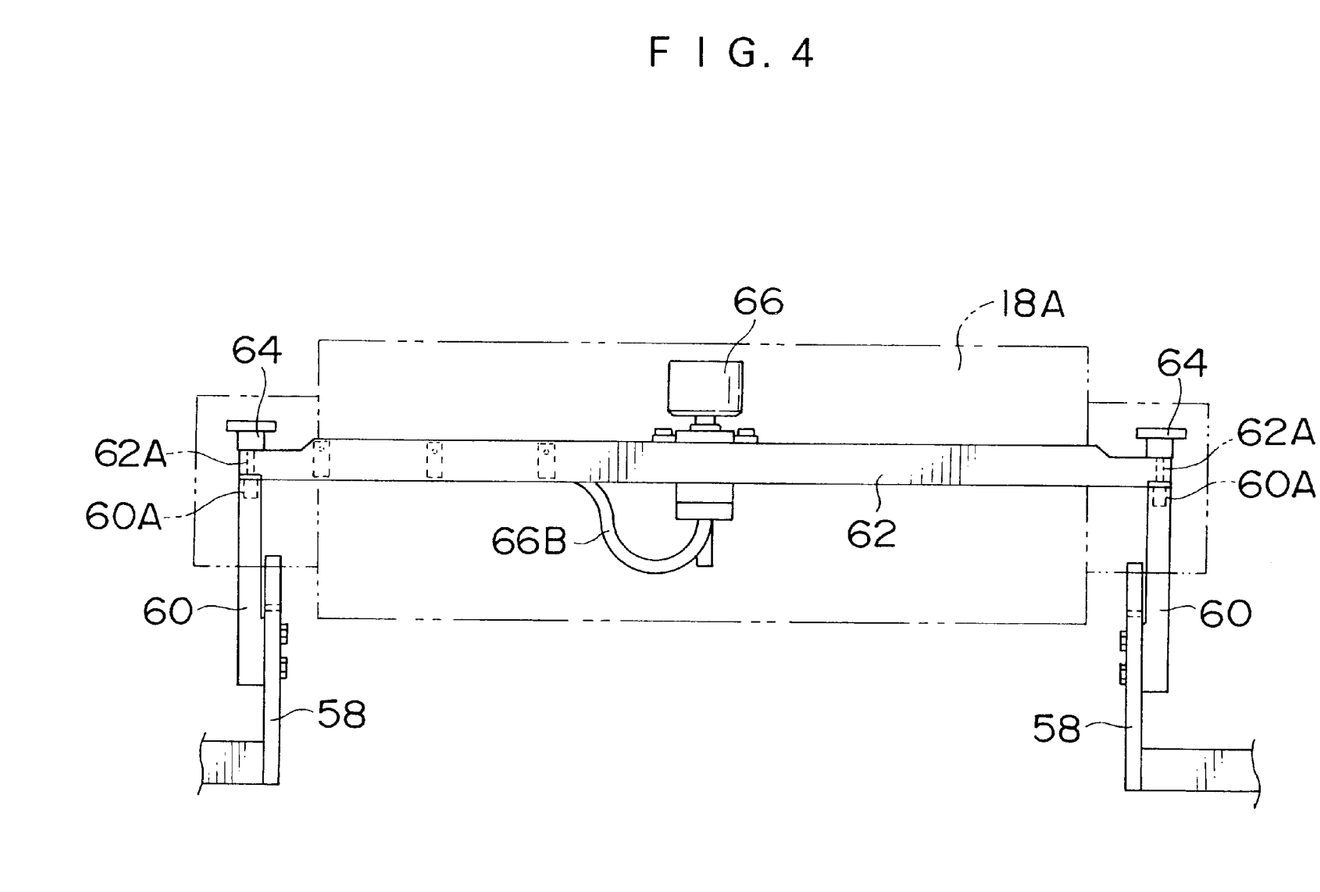
FIG. 4 is a front view showing the essential elements in FIG. 2.
Figure 5:
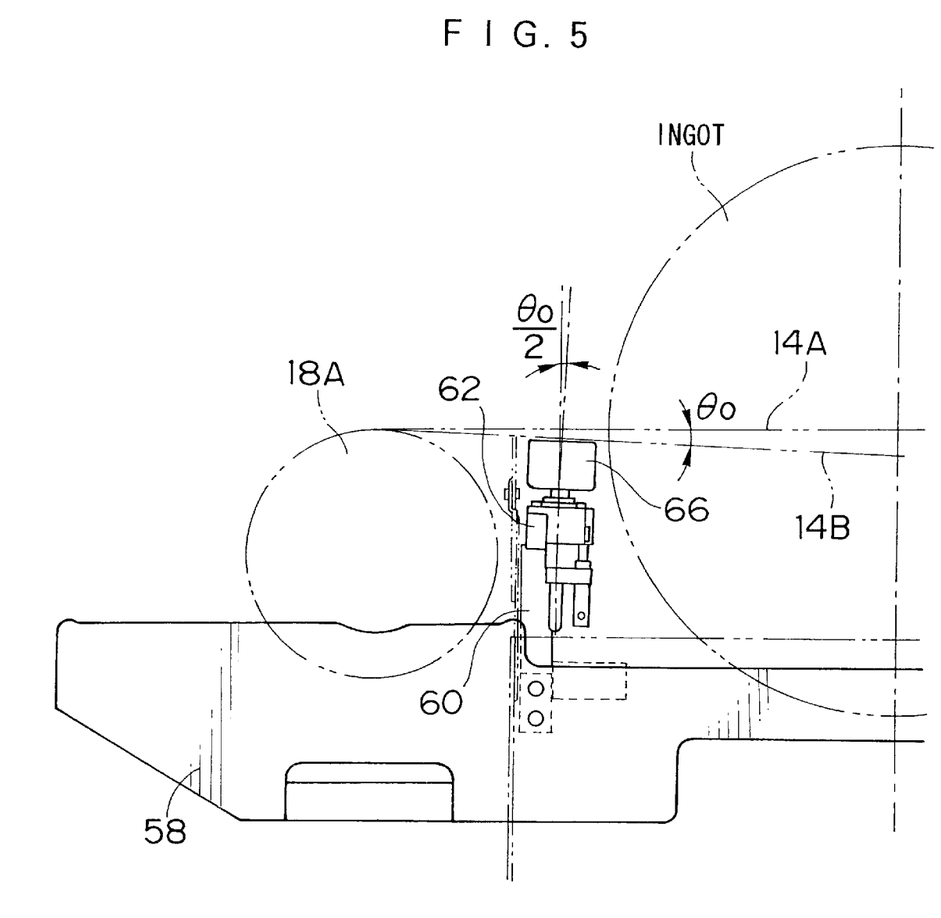
FIG. 5 is a side view showing the essential elements in FIG. 3.

FIGS. 3, 4 and 5 are a plan view, a front view and a side view, respectively, showing the essential parts of the first embodiment of this invention.

As shown in FIGS. 3–5, supports 60 are supported oppositely at the upper guide rails 58, and an attachment plate 62 is installed between the top ends of the supports 60. Screw holes 60A are vertically formed at the top ends of the supports 60, and holes 62A are formed at both ends of the attachment plates 62 so that they overlap the screw holes 60A. The attachment plate 62 is detachably attached to the supports 60 by inserting levers 64, in which male screws are formed at the end thereof, into the holes 62A and screwing down the ends of the levers 64 into the screw holes 60A.

A sensor 66 is mounted at the center of the attachment plate 62. The sensor 66 measures a distance to the wire 14 in a non-contact state. As shown in FIG. 5, the sensor 66 is inclined to the wire displacement direction by half of $\theta_0$ (i.e., $\theta_0/2$), which is an angle formed by an unloaded wire 14A and a wire 14B with a maximum allowable load (a reference value described later). The inclination of the sensor 66 by $\theta_0/2$ makes it possible to accurately measure the displacement of the wire 14 for the reasons stated below.

Figure 6:
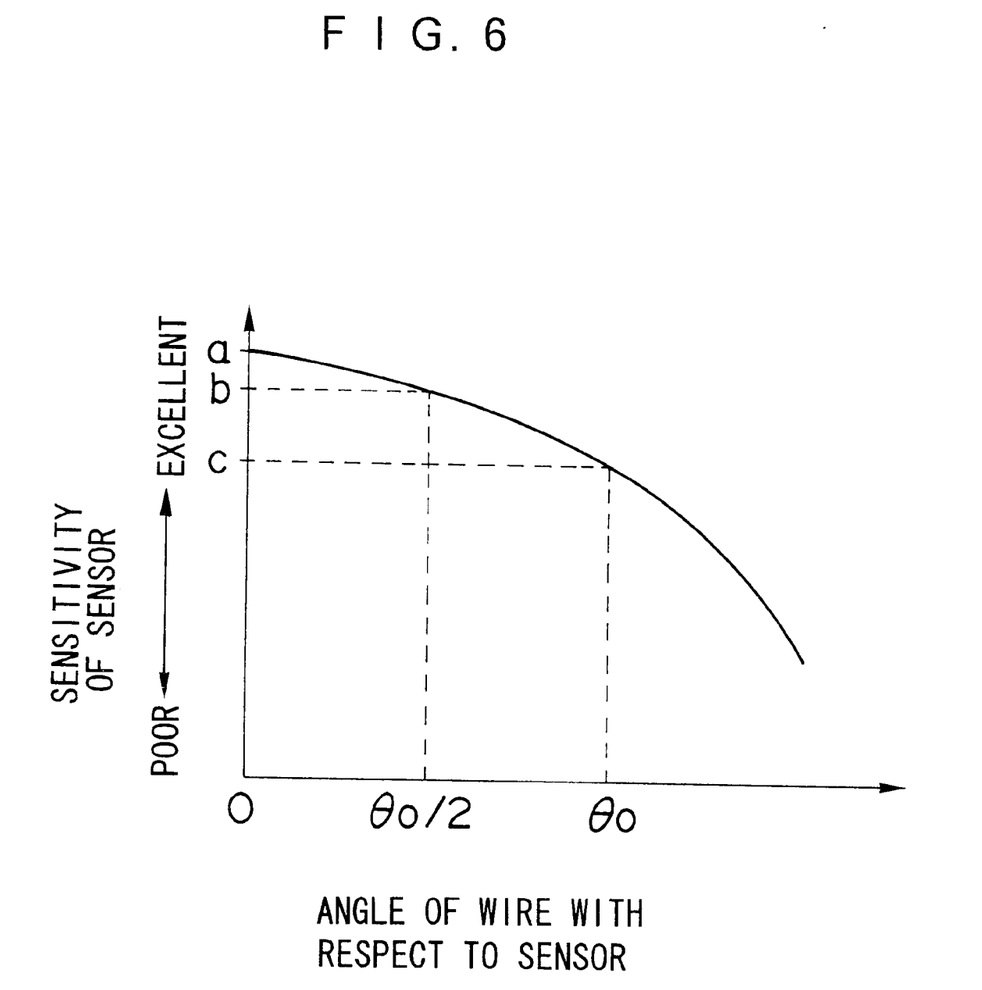
FIG. 6 is a view showing a relation between the sensitivity of a sensor and the angle of a wire.

FIG. 6 shows a relation between the angle of the wire 14 with respect to the sensor 66 and the sensitivity of the sensor 66.

As shown in FIG. 6, the wider the angle between the sensor 66 and the wire 14 is, the worse the measurement sensitivity becomes. If the sensor 66 is not inclined, the unloaded wire 14 (i.e., the angle 0) is measured with a sensitivity a and the wire 14 with the load of the reference value (i.e., the angle $\theta_0$) is measured with a sensitivity c. Therefore, if the sensor 66 is not inclined, the wire 14 with the load of the reference value cannot be measured accurately.

If the sensor 66 is inclined by $\theta_0/2$, the angle between the sensor 66 and the wire 14 is the maximum $\theta_0/2$ when the wire 14 is unloaded and is loaded with the load of the reference value. Thus, the sensor 66 can accurately measure the displacement of the wire 14 with the sensitivities a–b. The sensor 66 should not necessarily be inclined by $\theta_0/2$. If the sensor 66 is inclined by $\theta_0$ or less in the wire displacement direction, the displacement of the wire 14 can be measured accurately.

Figure 7:
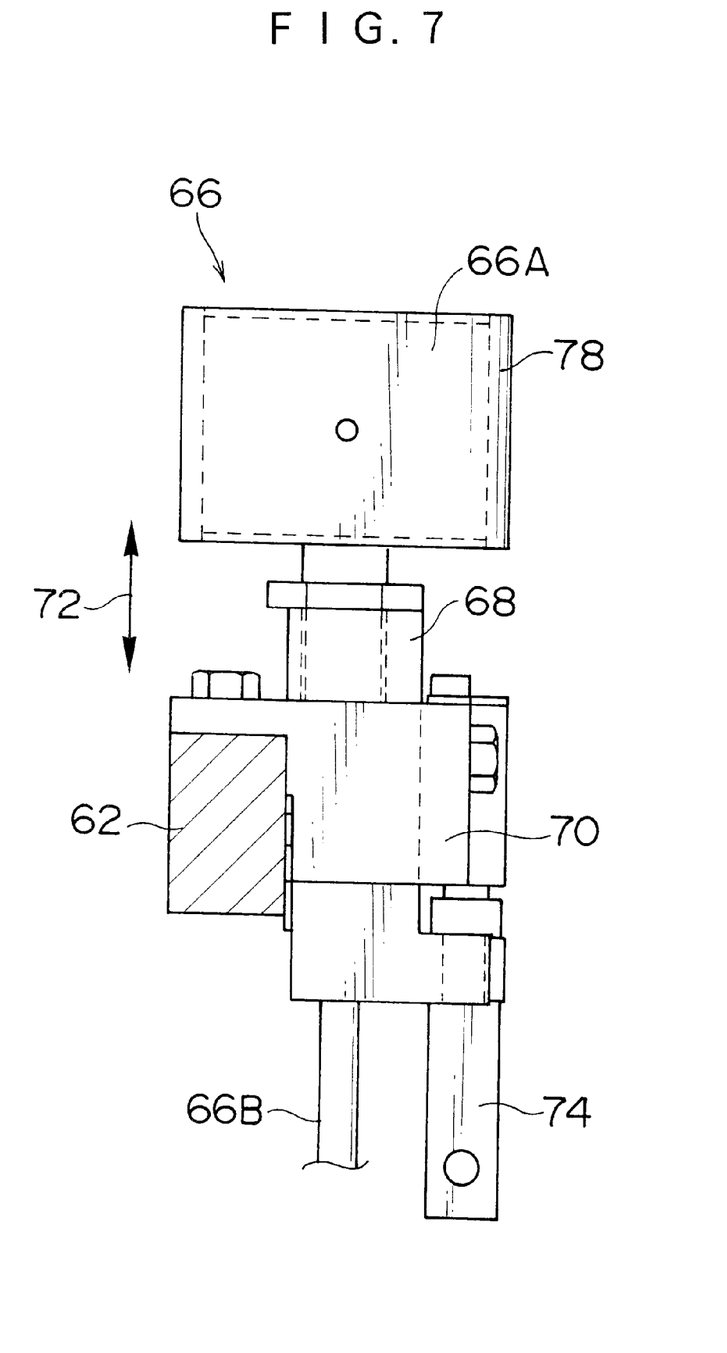
FIG. 7 is a front view showing a sensor in FIG. 2.
Figure 8:
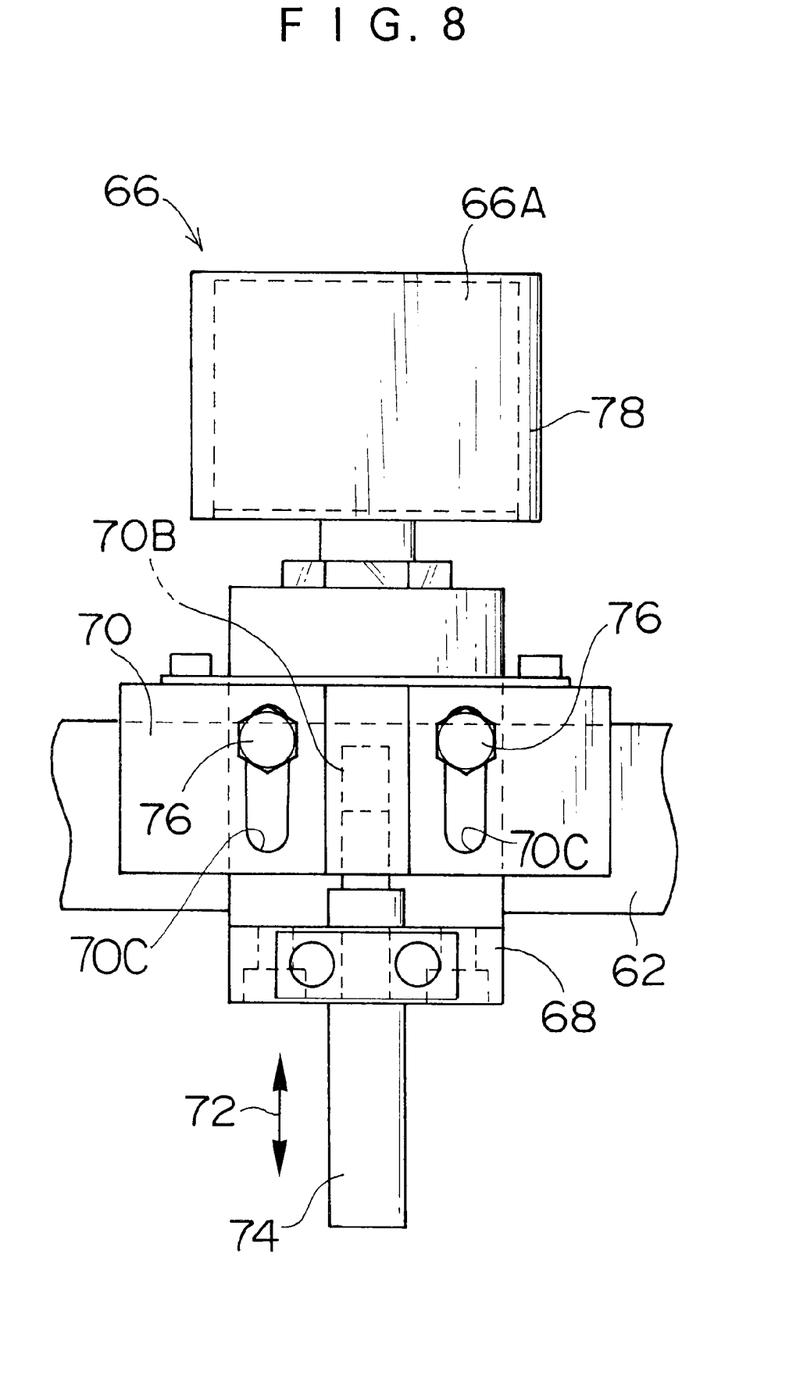
FIG. 8 is a side view showing the sensor in FIG. 7.
Figure 9:
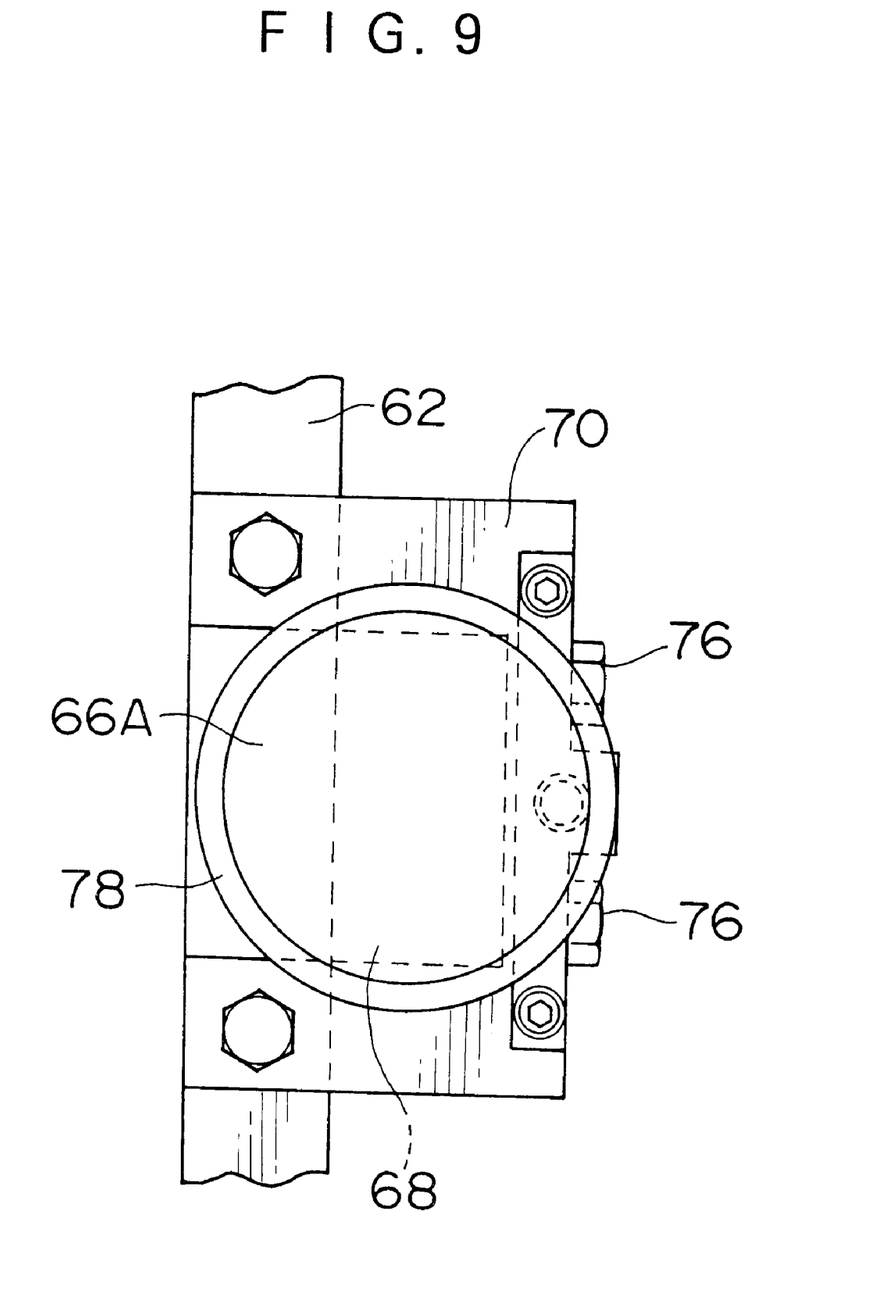
FIG. 9 is a front view showing the sensor in FIG. 7.

FIG. 7 is a front view of the sensor 66 taken along an arrow A in FIG. 3. FIGS. 8 and 9 are a plan view and a side view, respectively, of the sensor 66 in FIG. 7.

As shown in FIGS. 7–9, the sensor 66 is supported by a slide member 68, which is supported by a concave guide member 70 fixed on the attachment plate 62 in such a manner as to freely slide in a direction of an arrow 72. A control knob 74 is rotatably supported at the bottom of the slide member 68, and the top end of the control knob 74 is screwed into a threaded hole 70B formed in the guide member 70. Rotating the control knob 74 changes the screwed amount in the threaded hole 70B, and slides the slide member 68 which supports the control knob 74 with respect to the guide member 70.

A pair of bolts 76 is screwed to the slide member 68, and a pair of vertical slots 70C is formed in the guide member 70. The bolts 76 are inserted in the slots 70C. If the bolts 76 are loosened, they become capable of sliding within the slots 70C, and if the bolts 76 are tightened, they are fixed to the guide member 70. Thus, the bolts 76 can position the sensor 66 at a desired position below the wire row 20. Consequently, the sensor 66 can be disposed at a predetermined position where the distance between the unloaded wire 14A and the sensor 66 is previously recognized. The sensor 66 measures the distance between the sensor 66 and the wire 14 to thereby find the displacement (the deflection) of the wire 14.

Any device that is capable of measuring the distance to the wire 14 can be used as the sensor 66. The sensor 66 is, for example, an eddy-current displacement meter as a proximity sensor. The eddy-current displacement meter utilizes the fact that when a conductor is moved closer to a coil carrying a high frequency electric current, an eddy current is generated to effectively decrease an impedance of the coil. In the case of the sensor 66, a coil carrying a high frequency current is built in a column-shaped detecting part 66A. The detecting part 66A is covered with a cylindrical cover 78 made of nonconductive material such as plastics and ceramics. The cover 78 is attached to the detecting part 66A in such a manner that the end of the cover 78 projects from the end of the detecting part 66A. Therefore, the detecting part 66A can be protected from the displaced wire 14 and the slurry. The cover 78, which is made of the nonconductive material, never protects the detecting part 66A without affecting the measurement of the sensor 66.

Figure 10:
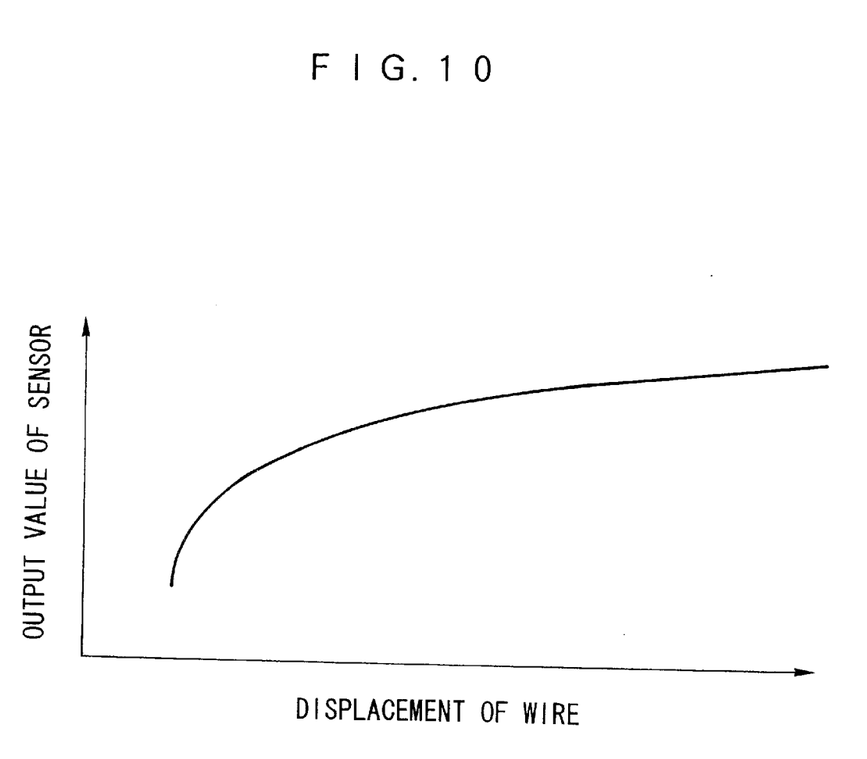
FIG. 10 is a table showing data for correcting an output value of the sensor.

The sensor 66 connects to a control part (not illustrated) provided in the wire saw 10 through a signal cable 66B. If the wire 14 is displaced, the sensor 66 outputs a signal representing the displacement as a change in the voltage to the control part. In response to the voltage signal from the sensor 66, the control part converts the voltage signal into the displacement of the wire 14 in accordance with a data table in FIG. 10. The data table is produced by previously measuring the changes in the output values of the sensor 66 with respect to the displacement of the wire 14. Consequently, the sensor 66 can accurately measure the displacement of the wire 14 even if there is a change in the inclination angle of the wire 14. Moreover, the sensor 66 can accurately measure the displacement of an object that has only a small inspection area like the wire 14.

When the displacement of the wire 14 is measured, the control part calculates the cutting load of the wire 14 by an equation described later and compares the calculated value with the reference value. Then, the control part outputs a signal for controlling the ingot feed speed to the drive unit 33 of the workpiece feed table 30 in accordance with the results of the comparison. If the cutting load of the wire 14 is larger than the reference value, the control part outputs a signal for lowering the ingot feed speed. If the cutting load is less than the reference value, the control part outputs a signal for raising the ingot feed speed. A cutting load can be set at the reference value in this manner since the cutting load of the wire 14 increases and decreases in association with the ingot feed speed. The cutting load for enabling the accurate slicing of the ingot is selected as the reference value, which is previously inputted to the control part.

A description will now be given of the equation for finding the cutting load.

Figure 11:
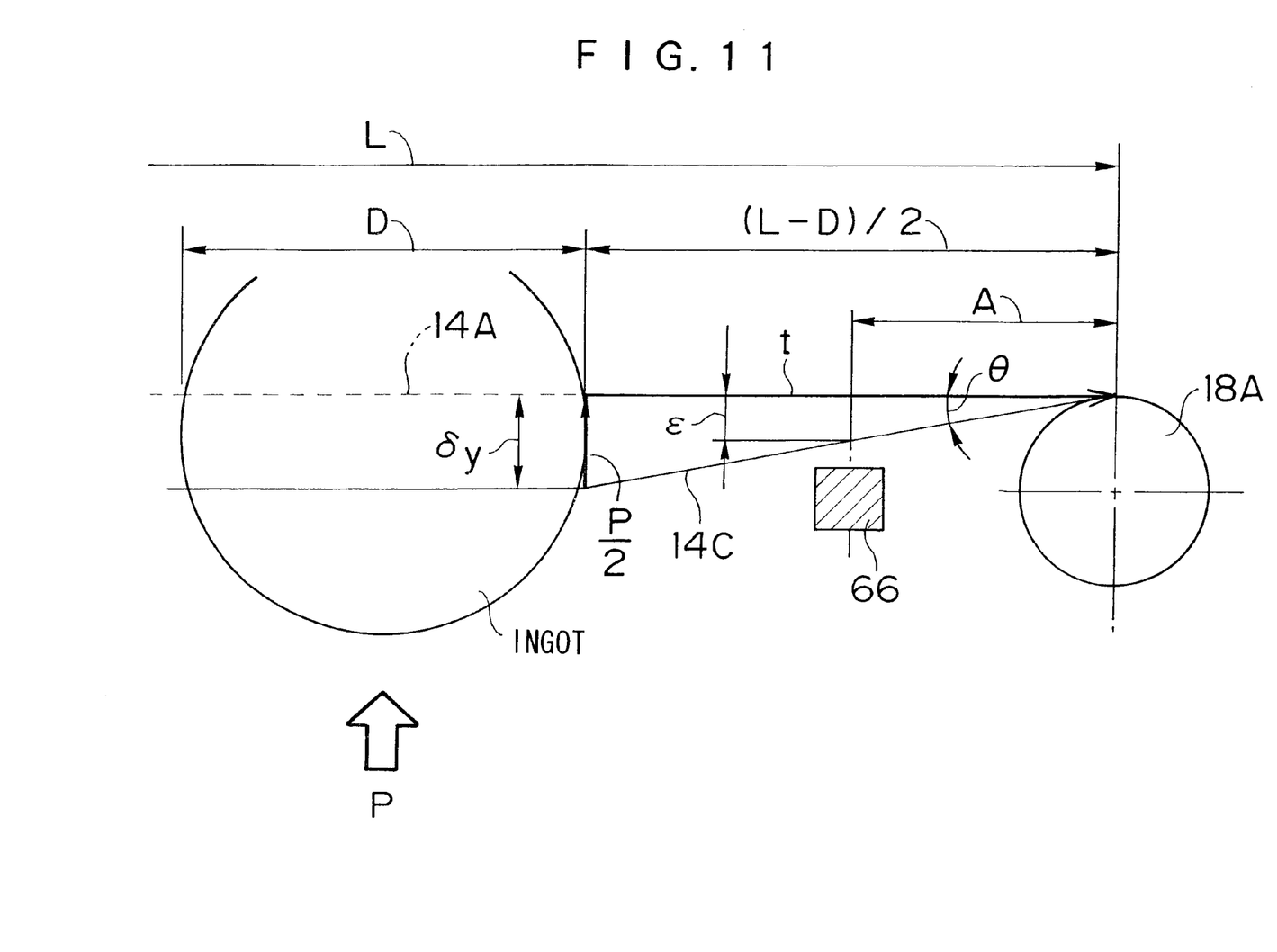
FIG. 11 is an explanation drawing showing a method for calculating a control load.

FIG. 11 is an explanation drawing showing the equation.

If the cutting load of the wire is P, the tension of the unloaded wire 14 (i.e., the cutting load P=0) is t, the displacement of the wire 14 found by measuring the distance to the wire 14 by the sensor 66 (the displacement from the unloaded wire) is $\epsilon$, and the distance between the sensor 66 and the center of the grooved roller 18A is A; the following equation (1) is formed, $$P/2 : t = \epsilon : A \tag{1}$$

Therefore, the cutting load P can be shown by the following equation (2), $$P = \epsilon T/A \qquad (2).$$

The distance A and the tension t are fixed values which can be measured in advance, and thus, the cutting load P is found by measuring the displacement $\epsilon$ of the wire 14.

If the wire deflection (the displacement) of the wire on a perpendicular line contacting with the maximum diameter part of the ingot is $\delta_y$ and the maximum diameter of the ingot is D, the wire deflection $\iota_y$ is found from the displacement $\epsilon$, measured by the sensor 66, by the following equation (3), $$\delta_y = \epsilon(L-D)/2A \qquad 3).$$

If the wire deflection of the wire 14 for accurately slicing the ingot is known from experience, the displacement $\epsilon$ may be converted into the wire deflection $\delta_y$ by the equation (3) to control the wire deflection $\delta_y$.

The cutting load P is found from an angle $\theta$ formed by the unloaded wire 14A and the loaded wire 14C, in accordance with the equation $P = 2t \cdot \tan\theta$. The cutting load P may be controlled by measuring the angle $\theta$. In this case, the angle $\theta$ may be found by providing two or more sensors 66, or may be found by using an ultrasonic sensor or an optical sensor as the sensor 66.

A description will now be given of the operation of the wire saw 10 that is constructed in the above-mentioned manner.

First, the ingot is mounted at the bottom of the workpiece feed table 30. Then, the motor 28 is run to rotate the wire reel 12 at the high speed and the motor 26 is run to rotate the grooved roller 18C at the high speed to thereby reciprocate the wire 14 at the high speed. When the running of the wire 14 is stabilized, the workpiece feed table 30 is lowered and the ingot is pressed against the running wire row 20. In this case, the slurry is supplied to an area where the wire row 20 contacts with the ingot through the nozzle (not illustrated), and the ingot is sliced into a number of wafers by the lapping operation of abrasive grains included in the slurry.

During the slicing of the ingot, the wire 14 forming the wire row 20 is deflected (displaced) downward by the cutting resistance of the ingot. The cutting resistance varies according to the shape of the ingot. In the case of the column-shaped ingot, the cutting resistance increases from the slicing start position to the slicing intermediate position, and then decreases to the cutting end position. The displacement of the wire 14 changes according to the changes in the cutting resistance of the workpiece.

The sensor 66 measures the displacement of the wire 14 and outputs the measured value to the control part (not illustrated).

When the sensor 66 outputs the displacement of the wire 14 to the control part, the control part calculates the cutting load P by the above-mentioned equation (2). Then, the control part compares the calculated cutting load P and the previously-inputted reference value, and outputs a signal for adjusting the vertically-moving speed of the workpiece feed table 30 in accordance with the results of the comparison. If the cutting load P is equal to the reference value, the ingot is being sliced properly and the ingot feed speed is maintained. The ingot feed speed is lowered if the cutting load P is larger than the reference value, and the ingot feed speed is raised if the cutting load P is smaller than the reference value. A cutting load P can be set at the reference value since the cutting load P is increased and decreased in association with the ingot feed speed.

Thus, the wire saw 10 of the first embodiment can always machine the workpiece with the proper cutting load $P_0$, and the ingot can be sliced accurately.

The wire saw 10 of the first embodiment calculates the cutting load P from the wire deflection of the wire 14, and controls the ingot feed speed by the cutting load P. It is possible to cope with the changes in the type of the ingot material only by finding the cutting load suitable for the material.

Moreover, the sensor 66 of the wire saw 10 is supported by the spindle bracket 42 through the attachment plate 62, the support 58 and the like, and thus, the sensor 66 can easily be positioned with respect to the wire row 20. The attachment plate 62, to which the sensor 66 is attached, is detachably attached to the support 58 through the lever 64 so that the sensor 66 can be attached and detached easily. This enables the efficient exchange of the wire 14 or the grooved rollers 18A–18D, which require the detachment and attachment of the sensor 66.

The wire saw 10 corrects the displacement of the wire 14 measured by the sensor 66 in accordance with the previously-formed data table, and it is therefore possible to accurately measure the wire 14 with the variable inclination angle.

A description will now be given of the wire saw according to the second embodiment.

Figure 12:
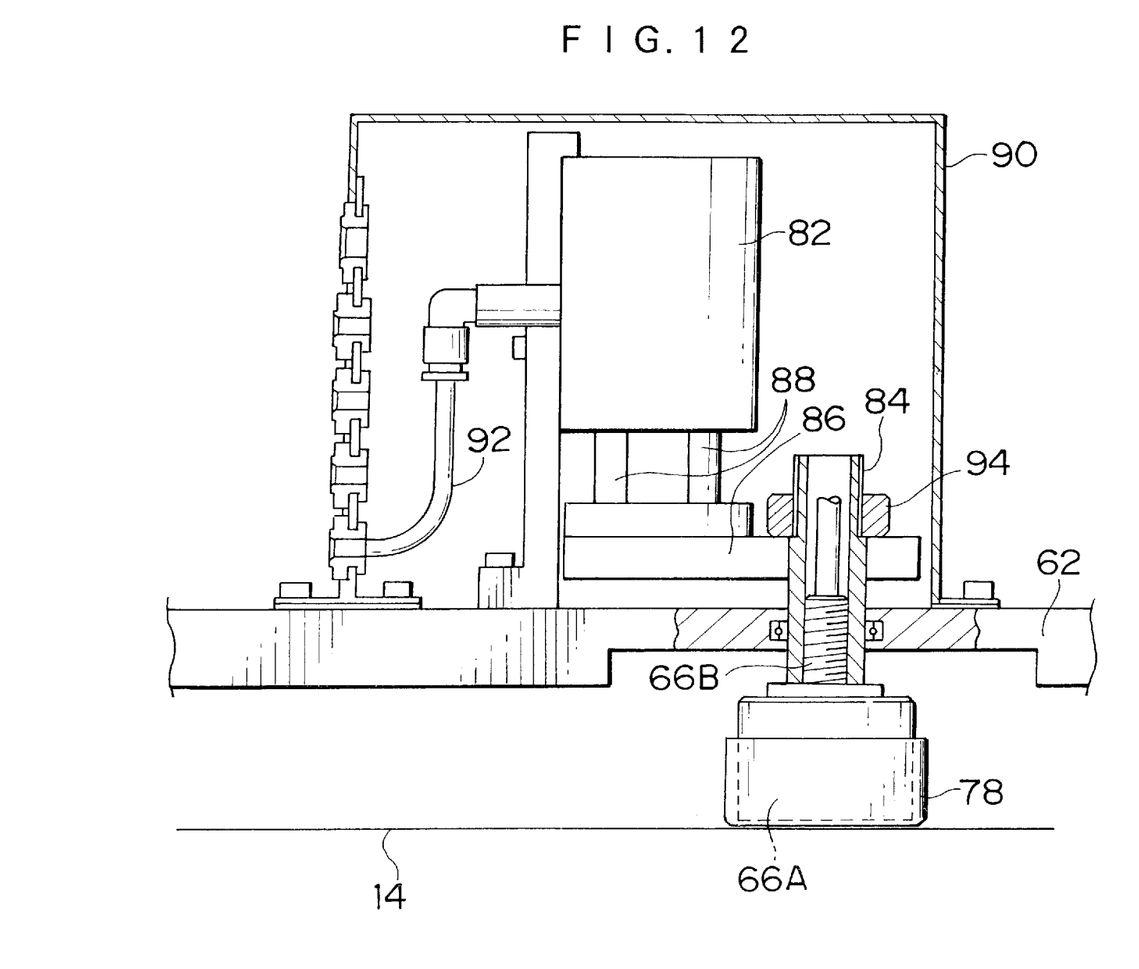
FIG. 12 is a front view showing the essential parts of a wire saw according to the second embodiment of the present invention.
Figure 13:
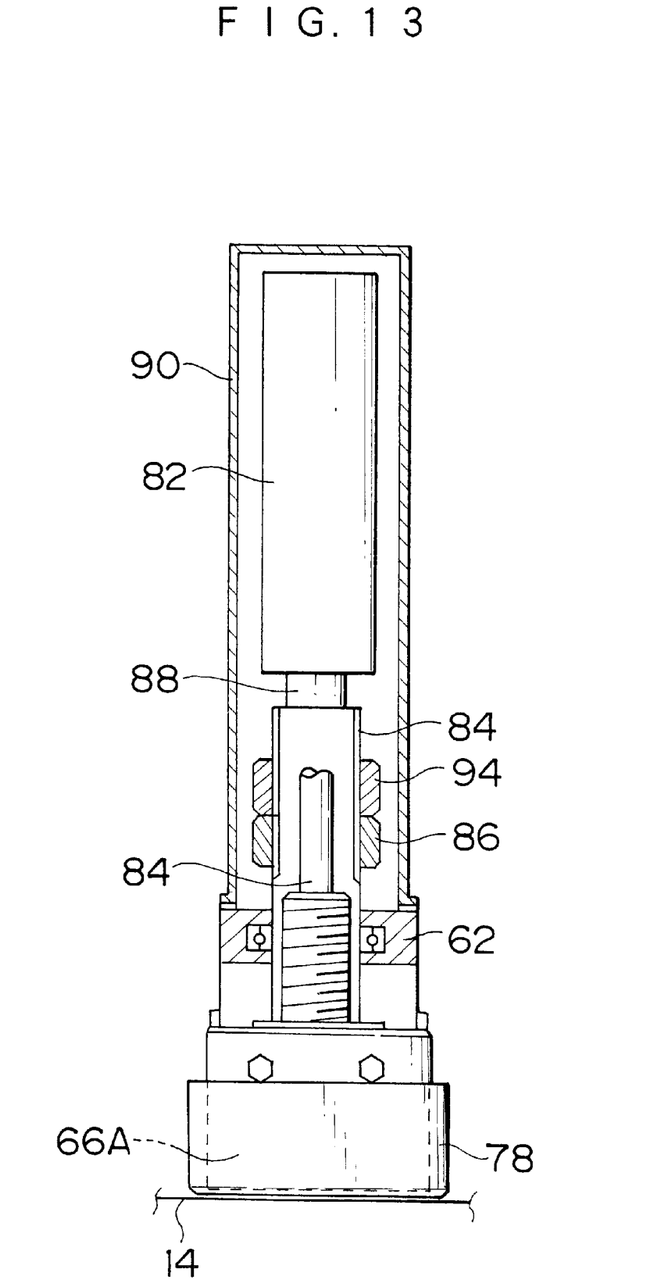
FIG. 13 is a side view showing the essential parts in FIG. 12.

FIGS. 12 and 13 are a front view and a side view, respectively, showing the essential parts of the wire saw according to the second embodiment.

As shown in FIGS. 12 and 13, the sensor 66 is arranged above the wire 14 forming the wire row 20. More specifically, the attachment plate 62 is arranged above the wire row 20, and the sensor 66 is downwardly attached to the attachment plate 62. The sensor 66 is attached to the attachment plate 62 through a lifting apparatus 82 (equivalent to drive means and moving means) such as an air cylinder, and the lifting apparatus 82 vertically moves the sensor 66. More specifically, a guide member 84 for supporting the sensor 66 is attached to a support member 86, which is fixed at the end of a rod 88 of the lifting apparatus 82. The lifting apparatus has an encoder (equivalent to a measuring means) (not illustrated) for measuring the vertical movement amount of the sensor 66.

The sensor 66, the lifting apparatus 82 and the encoder connect to a control part (not illustrated) through signal cables. In response to the measured values outputted from the sensor 66 and the encoder, the control part calculates the cutting load P, and adjusts the ingot feed speed so that the cutting load P can be the reference value. If the interval between the wire 14 and the sensor 66 is inappropriate, the control part drives the lifting apparatus 82 to adjust the interval between the sensor 66 and the wire 14. The case where the interval between the wire 14 and the sensor 66 s inappropriate is a case where it is impossible to accurately measure the distance between the sensor 66 and the wire 14 since the sensor 66 is too far from (or too close to) the wire 14.

In FIGS. 12 and 13, reference numeral 90 denotes a casing for the lifting apparatus 82; 92 denotes a pipe for an operational fluid vertically moving the rod 88; and 94 denotes an adjustment screw for vertically adjusting the position of the sensor 66.

In the wire saw of the second embodiment that is constructed in the above-mentioned manner, the control part adjusts the position of the sensor 66 with the lifting apparatus 82 in accordance with the displacement of the wire, and at the same time, adjusts the ingot feed speed so that the cutting load can be constant. Since the wire saw adjusts the position of the sensor 66 suitably for the displaced wire 14, the sensor 66 can accurately measure the displacement of the wire 14 in a wide range.

In the wire saw of the second embodiment, the control part controls the lifting apparatus 82 to move the sensor 66 away from the wire 14 in order to move back the sliced ingot from the wire row 20. This prevents the wire 14 dragged by the moved-back ingot from contacting with and damaging the sensor 66.

In the above-described wire saw, the sensor 66 is arranged above the wire row 20, and this prevents the slurry from adhering to the detecting part 66A of the sensor 66 and enables the accurate measurement of the wire displacement.

Moreover, the sensor 66 is arranged oppositely to the ingot feed direction, and this prevents the displaced wire 14 from contacting with and damaging the sensor 66.

In this embodiment, the eddy-current displacement meter is used as the sensor 66, but this invention should not be restricted to this. Any device that is capable of measuring the displacement of the wire 14 may be used as the sensor 66. For example, an ultrasonic sensor or the like may be used to detect the displacement of the wire 14.

As is clear from the equation (2), the cutting load P is constant if the displacement $\epsilon$ of the wire 14 is constant. Once the cutting load P is set at the reference value, the ingot can be sliced accurately if the ingot feed speed is adjusted so that the displacement $\epsilon$ of the wire 14 can be constant.

In this embodiment, the sensor 66 is attached to the center of the attachment plate 60, but this invention should not be restricted to this. The sensor 66 may be attached to any other place where it can detect the displacement of the wire 14.

In this embodiment, the looser abrasive wire saw is used, but a bonded abrasive wire saw may also be used.

As set forth hereinabove, the wire control method and the wire saw according to the present invention measure the displacement of the wire, calculate the cutting load in accordance with the measured displacement of the wire and the initial tension of the wire, and compare the calculated cutting load with the reference value to control the workpiece feed speed. This prevents the change in the cutting load, i.e., the wire deflection, and enables the accurate slicing of the workpiece.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wire saw control method, which comprises forming a wire row by winding a wire on a plurality of grooved rollers, running said wire, feeding a workpiece to said wire row and pressing said workpiece against said wire row while supplying a machining liquid to said wire row to thereby slice said workpiece into a number of wafers; said method comprising the steps of:

measuring a displacement of said wire forming said wire row during the slicing of said workpiece;

calculating a cutting load against said wire row in accordance with said measured displacement and an initial tension of said wire; and comparing said calculated cutting load with a preset reference value, and then slicing said workpiece while controlling a workpiece feed speed according to the results of the comparison.

2. A wire saw, which forms a wire row by winding a wire on a plurality of grooved rollers, runs said wire, feeds a workpiece to said wire row and presses said workpiece against said wire row while supplying a machining liquid to said wire row to thereby slice said workpiece into a number of wafers; said wire saw comprising:

a sensor for measuring a displacement of said wire forming said wire row during the slicing of said workpiece;

workpiece feeding means for moving said workpiece forward and backward with respect to said wire row; and control means for calculating a cutting load against said wire row in accordance with said displacement measured by said sensor and an initial tension of said wire, comparing said calculated cutting load with a preset reference value and controlling a workpiece feed speed of said workpiece feeding means according to the results of the comparison.

3. The wire saw as defined in claim 2, further comprising:

driving means for moving said sensor forward and backward with respect to said wire row; and measuring means for measuring the movement amount of said sensor, wherein said driving means moves said sensor forward and backward according to a position of said wire forming said wire row, and the movement amount measured by said measuring means is added to a measured value of said sensor to thereby calculate the displacement of said wire.

4. The wire saw as defined in claim 2, wherein said sensor is arranged above said wire row.

5. The wire saw as defined in claim 2, wherein said sensor is arranged at the opposite side of a side where said wire is displaced with respect to said wire row, and said wire saw has moving means for moving back said sensor from said wire row, said moving means moving back said sensor from said wire row when the sliced workpiece is moved back from said wire row.

6. The wire saw as defined in claim 2, wherein said sensor is detachably supported by a bracket rotatably supporting said plurality of grooved rollers.

7. The wire saw as defined in claim 2, wherein a cover is attached to a sensing part of said sensor in order to protect said sensing part.

8. The wire saw as defined in claim 2, wherein said sensor is inclined in a wire displaced direction with respect to said wire row, against which said workpiece has not yet been pressed, by a predetermined angle.

9. The wire saw as defined in claim 2, wherein the displacement of the wire measured by said sensor is corrected previously in accordance with a measured distance between said sensor and said wire.

* * * * *